United States Patent
Ozalevli

(10) Patent No.: US 11,609,250 B2
(45) Date of Patent: Mar. 21, 2023

(54) POWER MEASUREMENT AND MONITORING CIRCUIT FOR SWITCHING REGULATORS

(71) Applicant: Apple Inc., Cupertino, CA (US)

(72) Inventor: Erhan Ozalevli, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 251 days.

(21) Appl. No.: 17/033,555

(22) Filed: Sep. 25, 2020

(65) Prior Publication Data
US 2022/0099713 A1    Mar. 31, 2022

(51) Int. Cl.
| | |
|---|---|
| *G01R 19/165* | (2006.01) |
| *G01R 21/133* | (2006.01) |
| *H03M 3/04* | (2006.01) |
| *H02M 3/04* | (2006.01) |

(52) U.S. Cl.
CPC ..... *G01R 19/16528* (2013.01); *G01R 21/133* (2013.01); *H02M 3/04* (2013.01)

(58) Field of Classification Search
CPC . G01R 19/16528; G01R 21/133; H02M 3/04; H02M 3/156; H02M 3/157; H02M 1/0048; Y02B 70/10

USPC ...................................................... 324/103 R
See application file for complete search history.

(56) References Cited

U.S. PATENT DOCUMENTS

| | | |
|---|---|---|
| 6,879,133 B1 | 4/2005 | Geren |
| 7,414,806 B2 | 8/2008 | Saga |
| 8,629,669 B2 | 1/2014 | Tournatory et al. |
| 9,236,458 B2 * | 1/2016 | Konrath .............. H01L 29/1004 |
| 9,236,800 B2 * | 1/2016 | Tang ................... H02M 3/1584 |
| 9,520,772 B2 | 12/2016 | He et al. |
| 2005/0216808 A1 * | 9/2005 | Poechmueller ........ G11C 29/38 |
| | | 714/738 |
| 2013/0314101 A1 * | 11/2013 | Belet ......................... G05F 1/46 |
| | | 324/548 |

\* cited by examiner

*Primary Examiner* — Farhana A Hoque
(74) *Attorney, Agent, or Firm* — Fenwick & West LLP

(57) ABSTRACT

Embodiments relate to a power monitoring circuit. The power monitoring circuit includes a divider circuit that generates a reference voltage that is inversely proportional to a regulator voltage. Moreover, the power monitoring circuit includes an integrator that generates an integrator voltage by integrating one or more regulator currents. The power monitoring circuit additionally includes a comparator for comparing the output of the divider circuit and the output of the integrator. The comparator of the power monitoring circuit generates an output signal in response to the integrator voltage being larger than the reference voltage.

20 Claims, 7 Drawing Sheets

POWER MEASUREMENT AND MONITORING CIRCUIT FOR SWITCHING REGULATORS

BACKGROUND

1. Field of the Disclosure

The present disclosure relates to a power monitoring circuit in an electronic device.

2. Description of the Related Art

Power measurement and monitoring of switching regulators at their input and output allows systems to dynamically control module power dissipation and overall system efficiency, as well as, to manage the thermal budget of the system. The measurement and monitoring can be challenging due to the discontinuous and/or dynamic nature of the input and output currents. For example, buck or boost regulators can show a discontinuous behavior in their input or output current waveforms. Buck and boost regulators operate by opening and closing switches, which control whether current flows through the various components of the regulators. As such, the current waveforms of the regulators greatly fluctuate when the switches are closed or opened. This behavior makes calculating the power being consumed by regulator difficult. In particular, the behavior of switching regulators makes maintaining an accuracy of the measurement over a wide range of current difficult to achieve.

SUMMARY

Embodiments relate to a power monitoring circuit that includes a divider circuit for generating a reference voltage that is inversely proportional to a regulator voltage. The power monitoring circuit includes an integrator that generates an integrator voltage by integrating one or more regulator currents. The power monitoring circuit additionally includes a comparator for comparing the output of the divider circuit and the output of the integrator. The comparator of the power monitoring circuit generates an output signal in response to the integrator voltage being larger than the reference voltage.

In some embodiments, the power monitoring circuit additionally includes a clear switch. The clear switch clears the integrator. In some embodiments, the clear switch is controlled by a separate controller. Moreover, the clear switch may clear the integrator if the integrator voltage exceeds the reference voltage.

In some embodiments, the clear switch is controlled based on the output signal. That is, the clear switch is controlled to clear the integrator based on the value of the output signal. In this embodiment, the power monitoring circuit generates an oscillating output signal. Moreover, the power monitoring circuit includes a frequency to voltage converter for generating an output voltage having a voltage level based on the frequency of the output signal. In addition, the power monitoring circuit includes a second comparator for comparing the output voltage of the frequency to voltage converter with a threshold voltage. The second comparator generates an overpower signal based on the comparison. In some embodiments, the threshold voltage is generated using a digital-to-analog converter (DAC). The DAC receives a digital configuration signal and generates the threshold voltage based on the digital value of the configuration voltage.

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments relate to a power monitoring circuit. The power monitoring circuit includes a divider circuit that generates a reference voltage that is inversely proportional to a regulator voltage. Moreover, the power monitoring circuit includes an integrator that generates an integrator voltage by integrating one or more regulator currents. The power monitoring circuit additionally includes a comparator for comparing the output of the divider circuit and the output of the integrator. The comparator of the power monitoring circuit generates an overpower signal in response to the integrator voltage being larger than the reference voltage Exemplary Electronic Device Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are optionally used. In some embodiments, the device is not a portable communications device, but is a desktop computer or other computing device that is not designed for portable use. In some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

Figure 1:
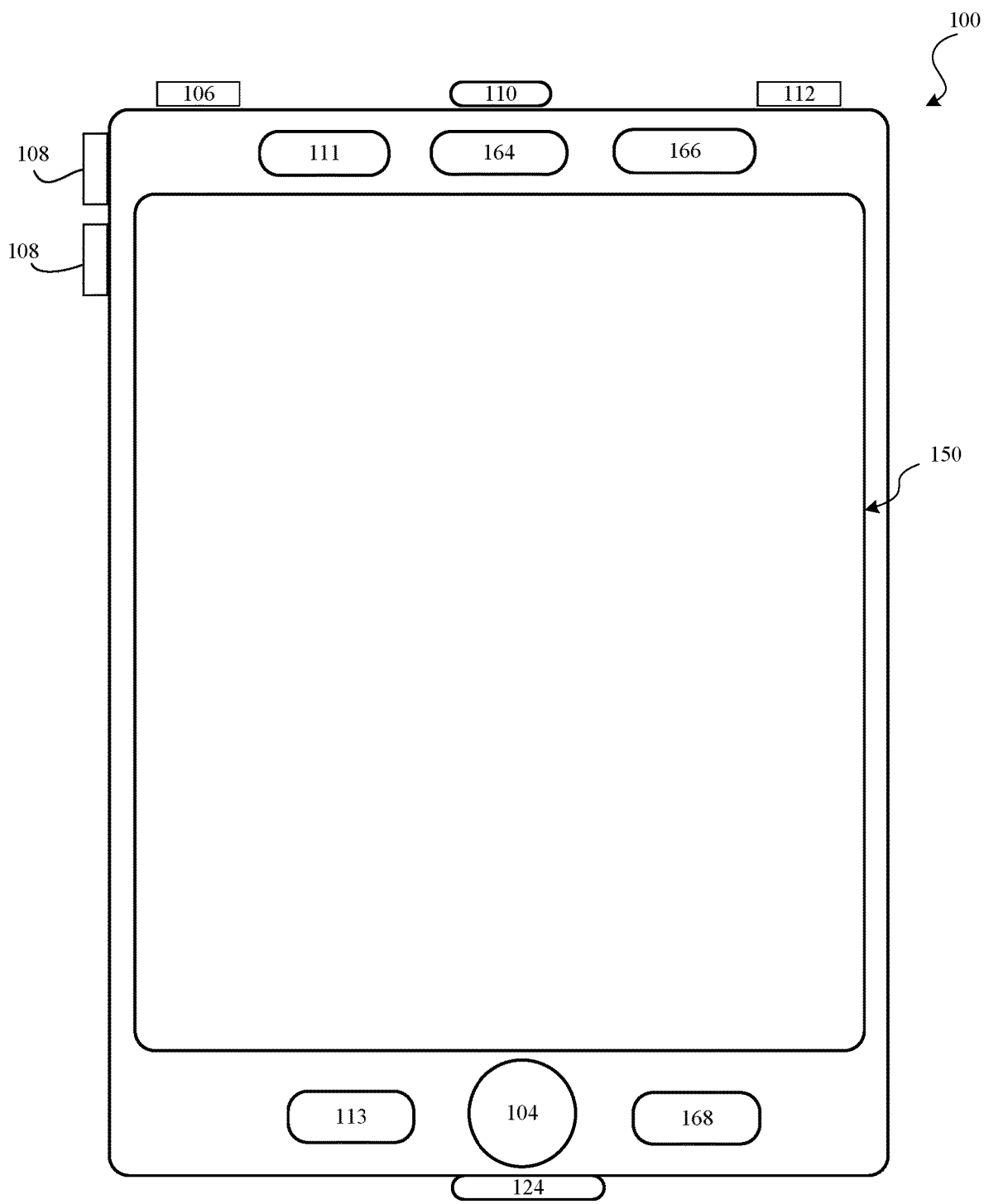
FIG. 1 is a high-level diagram of an electronic device, according to one embodiment.

FIG. 1 is a high-level diagram of an electronic device 100, according to one embodiment. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, head set jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. The device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. The device 100 may include components not shown in FIG. 1.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application specific integrated circuits (ASICs). Device 100 may include one or more current sense circuits described herein.

Example Current Sense Circuit

Figure 2B:
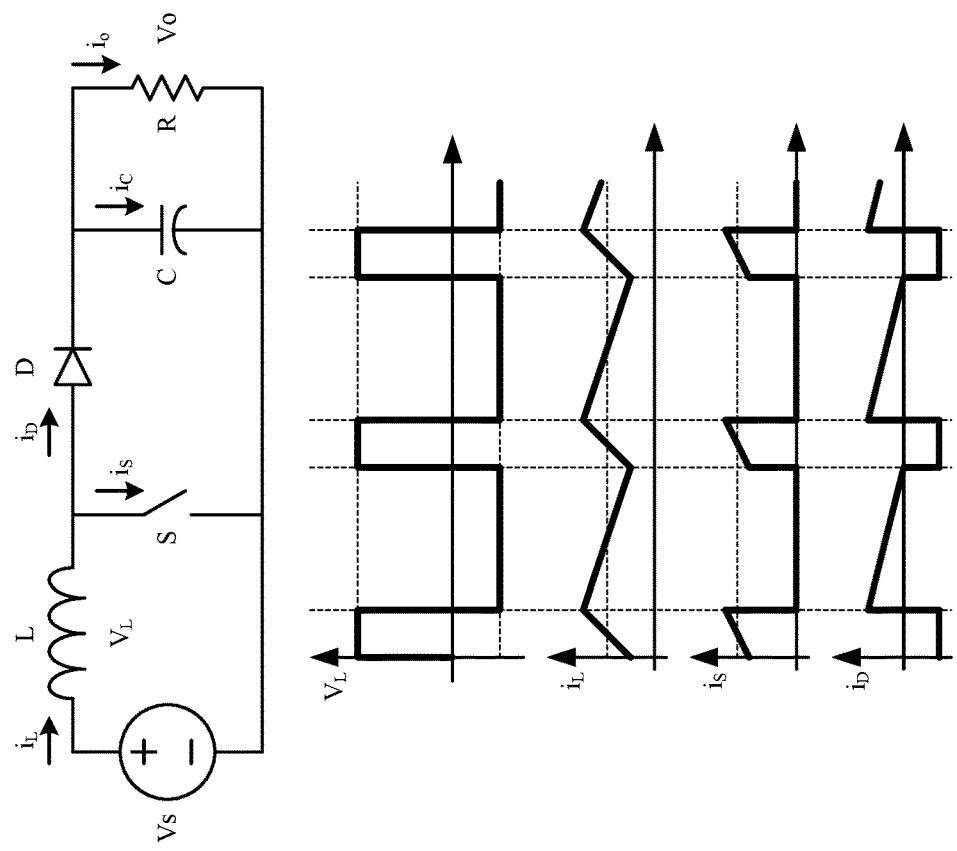
FIGS. 2A and 2B are schematic diagrams illustrating various examples of switching regulators, according to various embodiments.
Figure 2A:
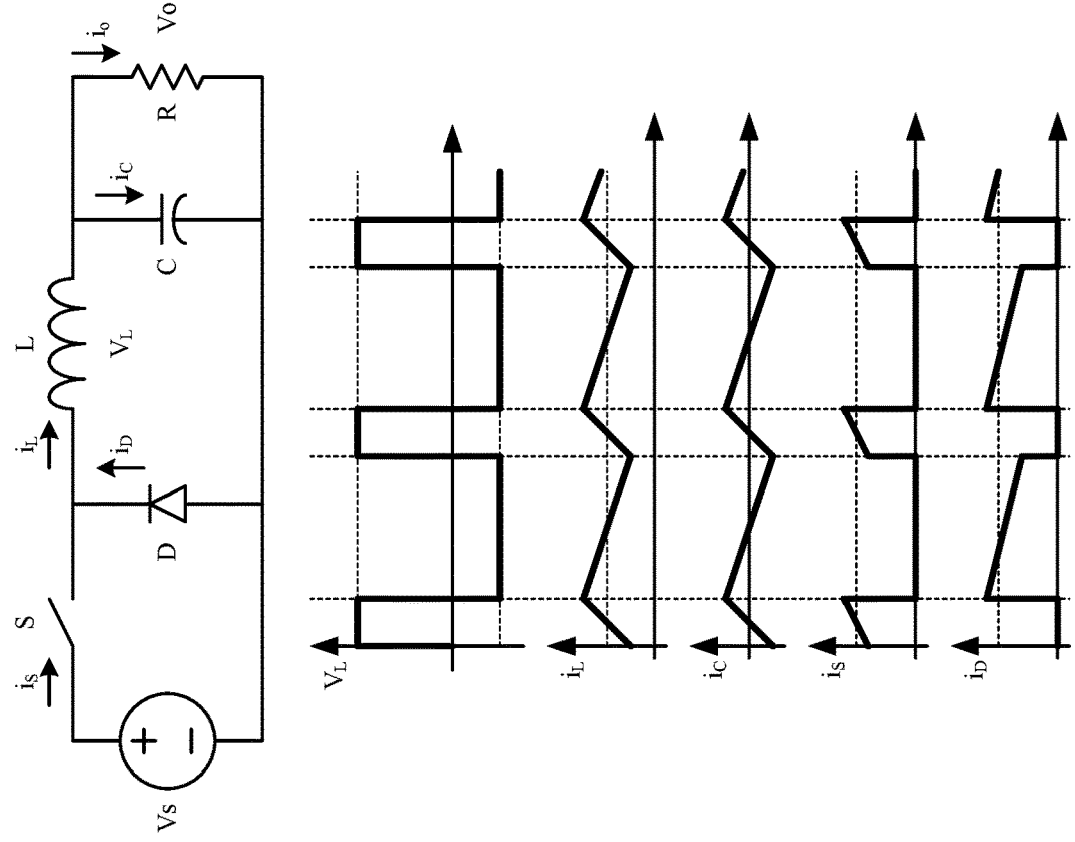

FIGS. 2A and 2B are schematic diagrams illustrating various examples of switching regulators, according to various embodiments. For the buck regulator shown in FIG. 2A, inductor current ripple is a function of inductor value L, input/output voltages Vs/Vo, and switching frequency. When regulated in close loop the average of the inductor current $i_L$ in steady state become equal to the output current $i_o$. However, the input current for the buck regulator $i_s$ discontinuous since input current $i_S$ is supplied only when switch S is closed. As a result, input current is can be determined using a large filtering of switch current.

Similarly, for the boost regulator shown in FIG. 2B, ripple of inductor current $i_L$ is a function of inductor value L, input/output voltages Vs/Vo, and switching frequency. When regulated in close loop the average of the inductor current $i_L$ in steady state become equal to the input current $i_S$. However, the diode current $i_D$ for the boost regulator is discontinuous since diode current $i_D$ is delivered only when switch S opens. As a result, output current $i_o$ can be determined using a large filtering of diode current.

Figure 3A:
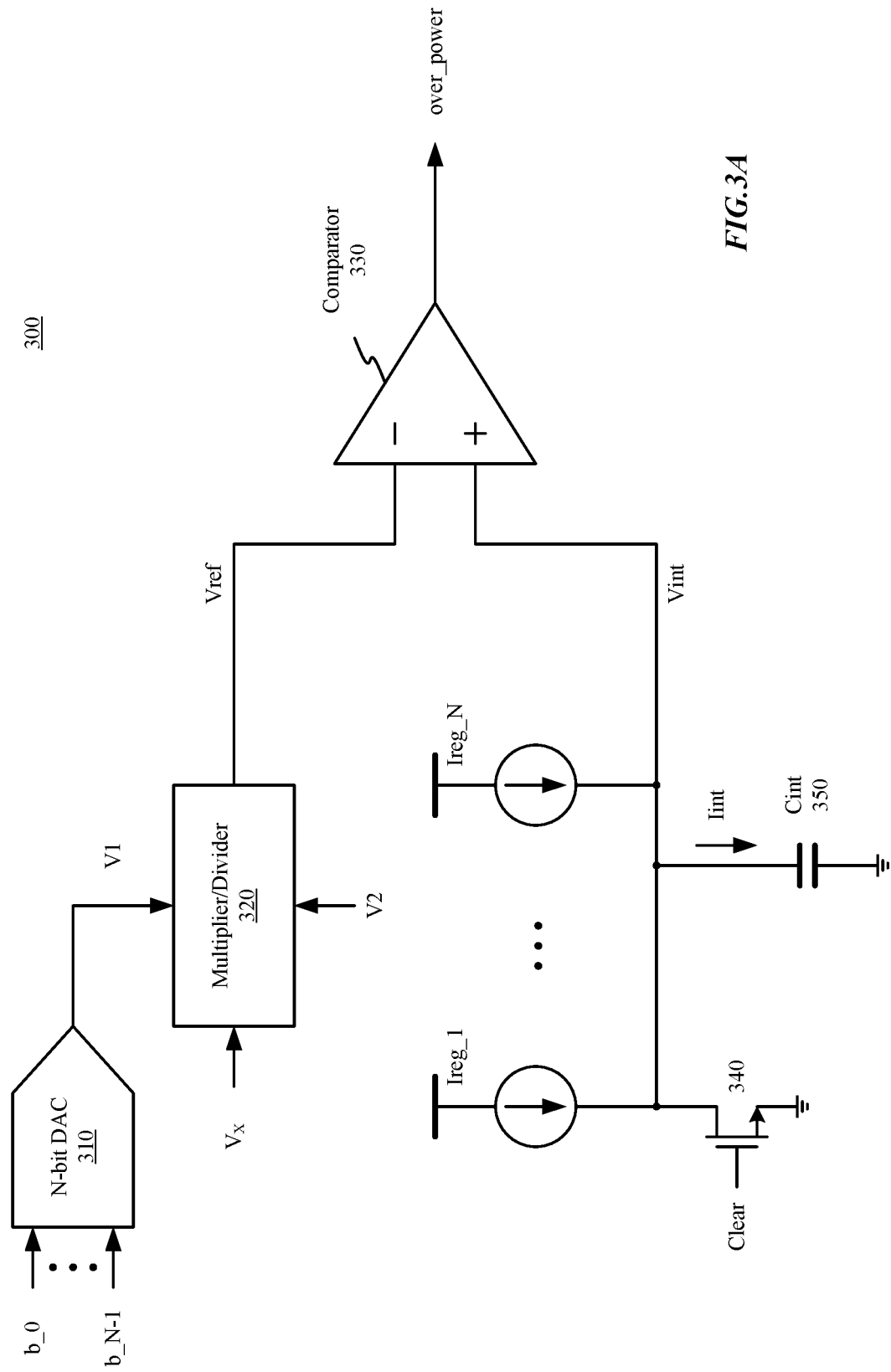
FIG. 3A is a schematic diagram illustrating a power monitoring circuit, according to one embodiment.

FIG. 3A is a schematic diagram illustrating a power monitoring circuit, according to one embodiment. The power monitoring circuit 300 determines whether total power of one or more switching regulators is higher than a power threshold value. For this purpose, the power monitoring circuit 300 may include, among other components, a comparator 330 that compares a reference voltage Vref and an integrator voltage Vint. If the integrator voltage Vint is larger than the reference voltage Vreg, the power monitoring circuit 300 outputs an overpower signal over_power having a predetermined value.

The power monitoring circuit 300 generates the reference voltage Vref using a multiplier/divider circuit 320. The multiplier/divider circuit 320 receives a first voltage V1, a second voltage V2 and a regulator voltage Vx. The second voltage V2 is a constant voltage that may be determined during a design phase or may be made programmable to scale the multiplication/division result. The first voltage V1 is a threshold voltage generated by DAC 310 based on a digital configuration signal b[0:N−1] to set a target overpower threshold. The multiplier/divider circuit 320 then multiples the first voltage V1 and second voltage V2 and divides the product by the regulator voltage Vx. That is, the reference voltage is generated as follows:

$$Vref = \frac{V1 \cdot V2}{Vx} \quad (1)$$

The multiplier/divider 320 may be an analog circuit that multiples the first voltage V1, the second voltage V2, and the regulator voltage Vx in the analog domain. An example of a multiplier/divider 320 is shown in FIG. 3B.

Figure 3B:
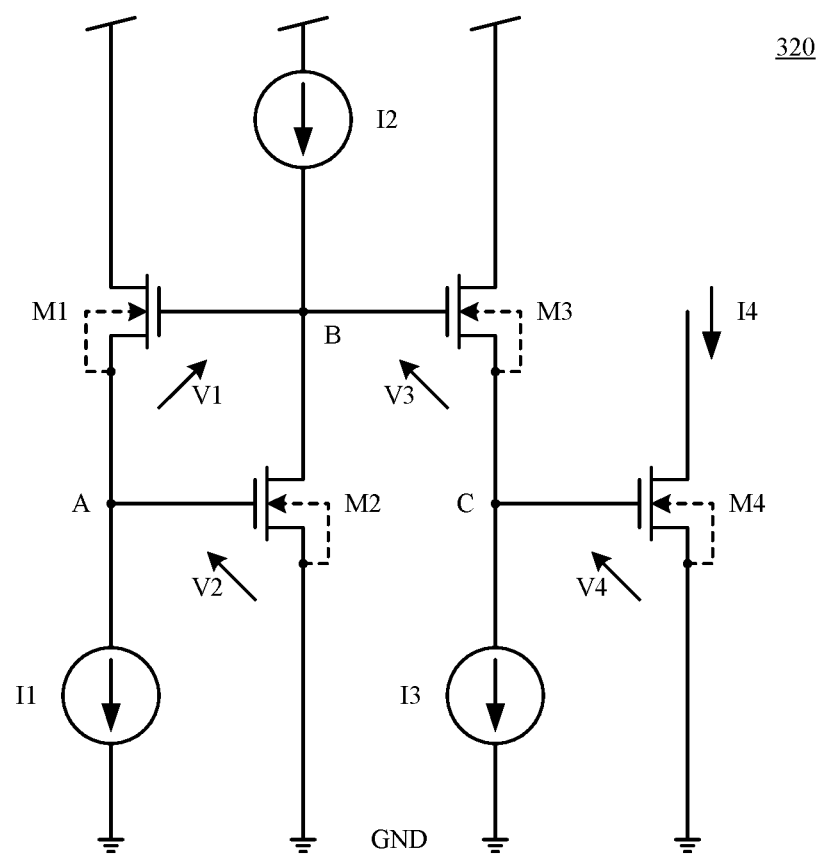
FIG. 3B is a schematic diagram illustrating an example of a multiplier/divider circuit, according to one embodiment.

FIG. 3B is a schematic diagram illustrating an example of a multiplier/divider circuit, according to one embodiment. The example implementation of a multiplier/divider circuit 320 of FIG. 3B includes four transistors M1 through M4 and three current sources $I_1$ through $I_3$. Moreover, the transistors M1 through M4 operate in the sub-threshold region. Although the multiplier/divider circuit of FIG. 3B is implemented using a CMOS architecture, a similar circuit implemented using bipolar junction transistors (BJT) may be used instead. Following the loop GND-A-B-C-GND, following current relationship can be obtained:

$$I_2 I_4 = I_1 I_3 \quad (2)$$

$$I_4 = \frac{I_1 I_2}{I_3} \quad (3)$$

Depending on whether input power or output power is to be measured or monitor, the regulator voltage may be one of various voltages of the one or more switching regulators. In some embodiments, the regulator voltage is the input voltage Vs of a switching regulator. In other embodiments, the regulator voltage is the output voltage Vo of the switching regulator. Moreover, the first voltage V1 is generated using a digital-to-analog converter DAC 310. The DAC 310 receives a digital signal and converts the digital signal into a corresponding analog voltage according to a predetermined transfer function. In addition, the second voltage V2 is a scaling voltage. The second voltage V2 might be a constant voltage provided to the multiplier/divider circuit 320 to produce a reference voltage Vref within a preselected voltage range.

The power monitoring circuit 300 generates the integrator voltage $V_{int}$ by integrating regulator currents Ireg from one or more regulators. For instance, in the schematic of FIG. 3A, the power monitoring circuit 300 generates the integrator voltage $V_{int}$ by integrating the regulator currents Ireg_1 through Ireg_N of N switching regulators. The power monitoring circuit 300 generates the integrator voltage $V_{int}$ using a capacitor Cint 350. The current $I_{int}$ flowing into the capacitor Cint 350 is the sum of all the regulator currents:

$$I_{int} = \sum_{k=1}^{N} \text{Ireg\_k} \quad (4)$$

Additionally, the capacitor voltage can be found as:

$$I_{int} = C_{int} \frac{dv}{dt} \quad (5)$$

$$V_{int} = \int_{t_0}^{t} dv = \frac{1}{C_{int}} \int_{t_0}^{t} I_{int} \cdot dt$$

Since the overpower signal is enabled when $V_{int}$ reaches the reference voltage Vref, the power threshold can be calculated as:

$$\frac{V1 \cdot V2}{Vx} = \frac{1}{C_{int}} \int_{t_0}^{t} I_{int} \cdot dt \quad (7)$$

Assuming a fixed integration time $t_{int}$ and an average integrator current $I_{sum}$, the power of the one or more regulators is equal to:

$$\text{Power} = Vx \cdot I_{sum} = \frac{V1 \cdot V2 \cdot C_{int}}{t_{int}} \quad (8)$$

The power monitoring circuit 300 includes a clear switch 340. The clear switch 340 clears the capacitor Cint 350. When the clear signal is enabled, the clear switch 340 is turned on, connecting the capacitor Cint 350 to ground, discharging the capacitor Cint 350. In some embodiments, the capacitor Cint 350 is cleared periodically. For example, the capacitor Cint 350 is cleared every $t_{int}$. If after a time period $t_{int}$ the comparator does not output the overpower signal having the active level, the system using the power monitoring circuit 300 may determine that an overpower event has not been triggered and thus, the switching regulators are operating below the power threshold.

Figure 4A:
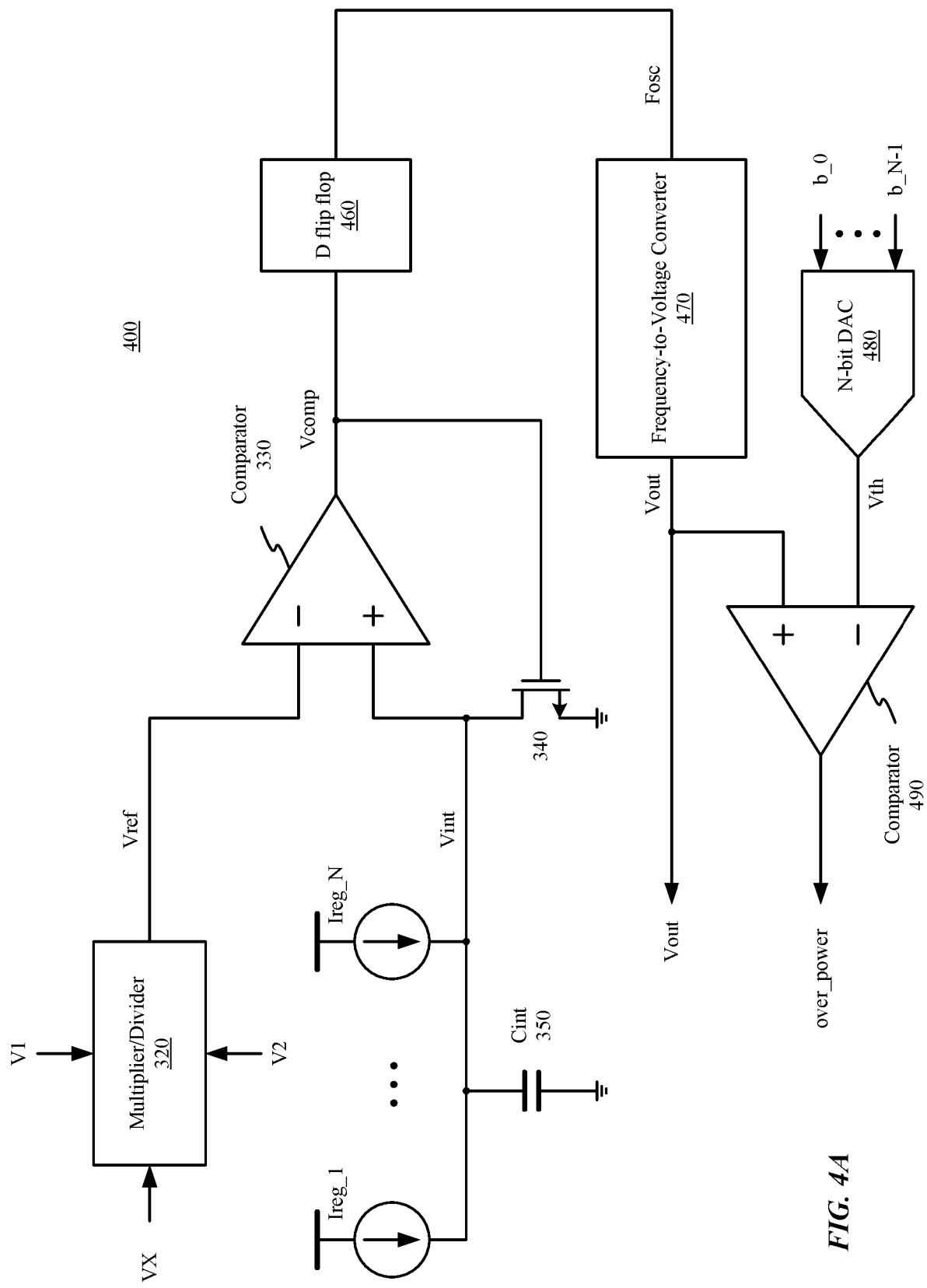
FIG. 4A is a schematic diagram illustrating a power monitoring circuit, according to another embodiment.

FIG. 4A is a schematic diagram illustrating a power monitoring and measuring circuit, according to another embodiment. The power monitoring and measuring circuit 400 generates an oscillating signal Fosc with a frequency that is correlated to the power of one or more switching regulators.

In the embodiment of FIG. 4A, the clear switch 340 is controlled based on the output $V_{comp}$ of the comparator 330. That is, when the level of the integrator voltage $V_{int}$ reaches or passes the level of the reference voltage Vref, the clear switch 340 is turned on, discharging the integrator capacitor Cint 350.

In some embodiment, the output $V_{comp}$ of the comparator 330 is delayed before being provided to the clear switch 340. For example, the power monitoring and measuring circuit 400 includes buffers or inverters (not shown) that preconditions and delays the control signal of the clear switch 340. By adding a delay to the output $V_{comp}$ of the comparator 330, the integration voltage $V_{int}$ is allowed to overshoot the reference voltage Vref. As such, the output $V_{comp}$ of the comparator 330 oscillates between an active level and an inactive level. Moreover, in some embodiments, the comparator 330 is designed to have a large gain such that the output $V_{comp}$ saturates to the active level when the integration voltage $V_{int}$ exceeds the reference voltage Vref, and saturates to the inactive level when the integration voltage drops below the reference voltage Vref.

In other embodiments, the power monitoring and measuring circuit 400 includes additional circuitry that holds the value of the output $V_{comp}$ of the comparator for at least predetermined amount of time after the output signal $V_{comp}$ transitions to an active level. For example, the power monitoring and measuring circuit 400 may include a latch (not shown) that holds the output $V_{comp}$ of the comparator 330 at an active value for at least a predetermined amount of time after the output $V_{comp}$ switches from the active value to the inactive value.

In other embodiments, the comparator 330 is designed to have hysteresis. For example, the comparator 330 outputs a signal $V_{comp}$ that switches from an inactive level to an active level when the integration voltage $V_{int}$ reaches the reference voltage Vref, and switches from the active level to the inactive level when the integration voltage $V_{int}$ drops to a predetermined level (e.g., ground).

As such, the power monitoring and measuring circuit 400 generates an oscillating signal Fosc. The frequency of the oscillating signal Fosc is correlated to the power being consumed or output by the switching regulator. Thus, the power monitoring and measuring circuit 400 is able to monitor the power of the switching regulator by monitoring the frequency of the oscillating signal.

The power monitoring and measuring circuit 400 further includes a frequency-to-voltage converter 470 that receives the oscillating signal Fosc and generates an output voltage Vout having a level that is correlated to the frequency of the oscillating signal. In some embodiments, the frequency-to-voltage converter 470 is a linear converter. An example of a linear frequency-to-voltage converter is shown in FIG. 4B.

Figure 4B:
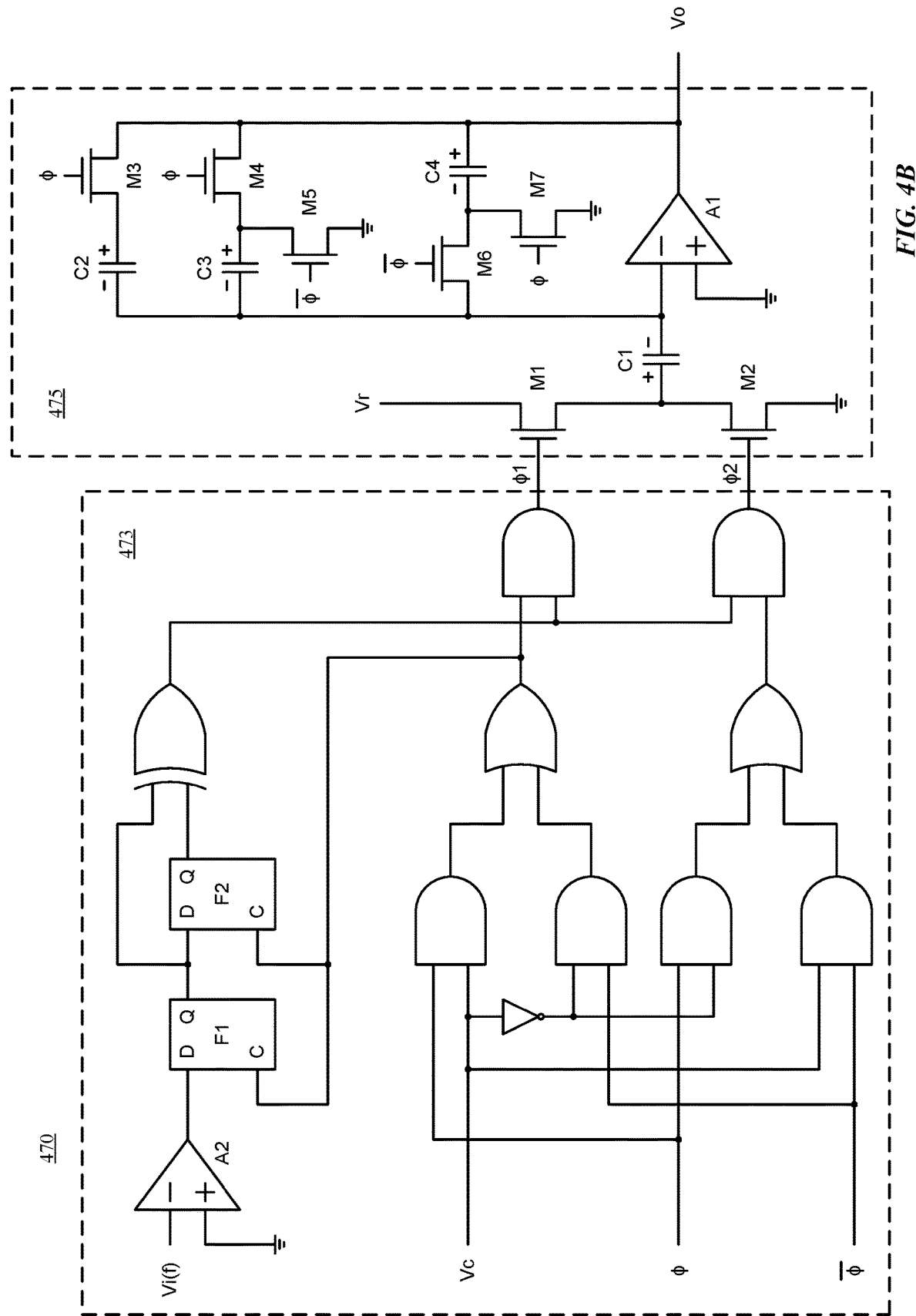
FIG. 4B is a schematic diagram illustrating an example linear frequency-to-voltage converter, according to another embodiment.

FIG. 4B is a schematic diagram illustrating an example linear frequency-to-voltage (F/V) converter, according to another embodiment. The F/V converter 470 includes a differentiator 473 and a switched capacitor damped integrator 475. The switched capacitor damped integrator 475 includes a comparator A1, a first capacitor C1 coupled to a first input (e.g., an inverting input) of the comparator A1, multiple capacitors C2, C3, C4 coupled between an input of the comparator A1 and the output of the comparator A1, and multiple switches M1 through M7. Moreover, the differentiator 473 includes a comparator A2, two flip-flops (e.g., D flip-flops) F1 and F2, and logic gates.

The differentiator 473 portion of the F/V converter detects the rising and falling edges of the input signal $V_i(f)$ in synchronism with nonoverlapping phase clocks $\phi$ and $\bar{\phi}$. In some embodiment, which clock ϕ or ϕ̄ is used for sensing the edges is determined by the logic level of Vc. When Vc has a logic level of "1" or "high," the ϕ clocks which follow immediately after the following the rising edges of the input signal $V_i(f)$ turn the switch M1 on, charging capacitor C1 to the reference voltage Vr. The switched-capacitor circuit then operates as an inverting damped integrator and produces the output voltage with a negative polarity.

Conversely, if Vc has a logic level of "0" or "low," the ϕ̄ clocks immediately following the rising and falling edges of the input signal $V_i$ (f) turn the switch M1 on, charging capacitor C1 to the reference voltage Vr. The damped integrator then produces the output voltage with a positive polarity.

Referring back to FIG. 4A, the power monitoring and measuring circuit 400 includes a comparator 490 that compares the output voltage Vout from the frequency-to-voltage converter 470 to a threshold voltage Vth. The threshold voltage Vth may be generated using a digital-to-analog converter (DAC) 480. The DAC 480 receives a configuration signal b[0:N−1] and generates the threshold voltage Vth based on the configuration signal b[0:N−1]. The comparator 490 generates an overpower signal over_power based on the comparison between the output voltage Vout and the threshold voltage Vth. If the output voltage Vout is larger than the threshold voltage Vth, the comparator 490 generates an overpower signal having an active level. By modifying the threshold voltage Vth, the configuration signal b[0:N−1] is able to modify how high the output voltage, and thus the power of the switching regulator, is allowed to reach before the comparator outputs the overpower signal having the active level.

The power monitoring circuits described herein are able to maintain an accurate power calculation across a wide current range. The integration of the regulator current (e.g., input regulator current or output regulator current) makes the power calculation performed by the power monitoring circuits less susceptible to switching noises and processing inaccuracies. Additionally, the discontinuities in the regulator current becomes less relevant in the power calculation as the current is integrated over time. Moreover, the conversion of regulator power to an oscillating signal allows the power monitoring circuit to achieve an accurate power calculation while keeping the circuit size small.

Operation of the Switching Regulator Power Monitoring Circuit

Figures 5A, 5B:
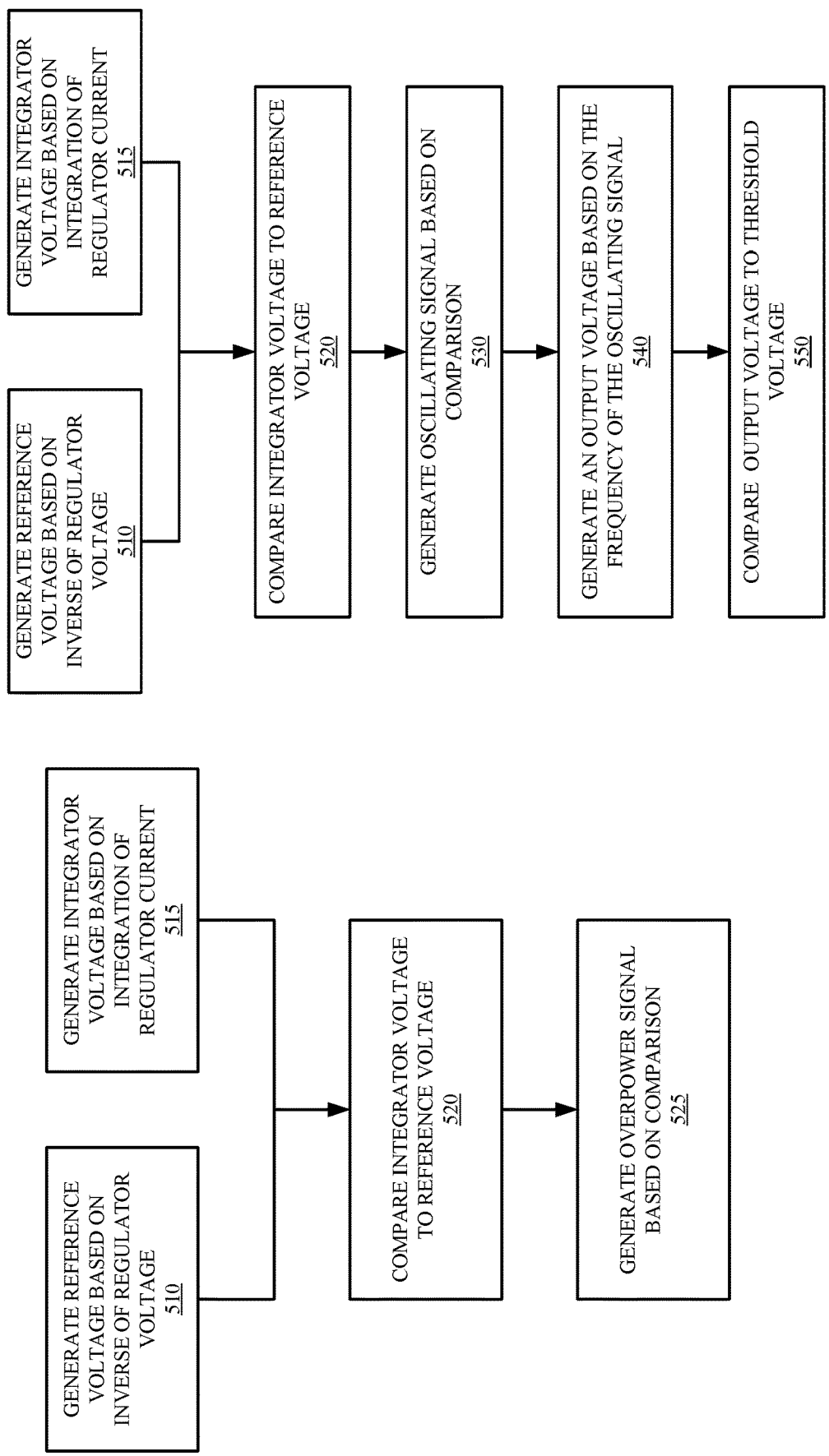
FIG. 5A illustrates a flow diagram of a process for monitoring the power of one or more switching regulators, according to one embodiment.
FIG. 5B illustrates a flow diagram of a process for monitoring the power of one or more switching regulators, according to another embodiment.

FIG. 5A illustrates a flow diagram of a process for monitoring the power of one or more switching regulators, according to one embodiment. The power monitoring circuit 300 generates 510 a reference voltage Vref based on an inverse of the regulator voltage Vx. In some embodiments, the reference voltage is generated by a multiplier/divider circuit 320. The multiplier/divider circuit 320 receives a first configurable voltage V1, a second scaling voltage V2, and the regulator voltage Vx. The multiplier/divider circuit 320 the generates the reference voltage Vref as:

$$Vref = \frac{V1 \cdot V2}{Vx} \qquad (9)$$

The power monitoring circuit 300 generates 515 an integrator voltage Vint based on an integration of one or more regulator currents from one or more switching regulators. The integrator voltage Vint may be generated by a capacitor that receives the regulator currents and accumulates charge based on the received regulator currents.

A comparator 330 of the power monitoring circuit 300 compares 520 the integrator voltage Vint to the reference voltage Vref. The comparator 330 then generates 525 an overpower signal based on the comparison between the integrator voltage Vint and the reference voltage Vref. In some embodiments, if the integrator voltage Vint is lower than the reference voltage Vref, the comparator 330 outputs a signal $V_{comp}$ having an inactive level. However, if the integrator voltage Vint is larger than the reference voltage Vref, the comparator 330 outputs a signal $V_{comp}$ having an active level.

FIG. 5B illustrates a flow diagram of a process for monitoring the power of one or more switching regulators, according to another embodiment. The power monitoring and measuring circuit 400 generates 510 a reference voltage Vref based on an inverse of the regulator voltage Vx. In some embodiments, the reference voltage is generated by a multiplier/divider circuit 320.

The power monitoring and measuring circuit 400 generates 515 an integrator voltage Vint based on an integration of one or more regulator currents from one or more switching regulators. The integrator voltage Vint may be generated by a capacitor that receives the regulator currents and accumulates charge based on the received regulator currents.

Based on the comparison between the integrator voltage Vint and the reference voltage Vref, an oscillating signal Fosc is generated 530. In some embodiments, to generate the oscillating signal, the integrator integrating the regulator currents is discharged based on the comparison between the integrator voltage Vint and the reference voltage Vref. For example, the capacitor 350 is discharged when the integrator voltage Vint reaches or exceeds the reference voltage Vref. In some embodiments, the integrator is discharged by turning on switch 340 based on the output $V_{comp}$ of the comparator 330. In some embodiments, the oscillating signal Fosc is further generated using a flip-flop (e.g., a D flip-flop) or a latch 460. The flop-flop or latch 460 stores the output of the comparator 330.

An output voltage Vout is generated 540 based on a frequency of the oscillating signal Fosc. The output voltage Vout may be generated using a frequency-to-voltage converter 470 (e.g., a linear frequency-to-voltage converter) that generates an output having a voltage that is proportional to the frequency of the oscillating signal Fosc.

Comparator 490 of the power monitoring and measuring circuit 400 compares 550 the output voltage Vout to a threshold voltage Vth and an overpower signal is generated based on the comparison. In some embodiments, if the output voltage Vout is lower than the threshold voltage Vth, the comparator 490 outputs a signal having an inactive level. However, if the output voltage Vout is larger than the threshold voltage Vth, the comparator 490 outputs a signal having an active level.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A power monitoring circuit, comprising:

a divider circuit configured to generate a reference voltage inversely proportional to a regulator voltage;

an integrator circuit configured to integrate one or more regulator currents to generate an integrator current with an integrator voltage;

a clear switch coupled to the integrator circuit, the clear switch configured to clear the integrator circuit responsive to switching of the clear switch; and a first comparator circuit having a first input coupled to the divider circuit for receiving the reference voltage, and a second input coupled to the integrator circuit for receiving the integrator voltage, the first comparator circuit configured to generate an output signal in response to the integrator voltage exceeding the reference voltage.

2. The power monitoring circuit of claim 1, wherein the clear switch is controlled to turn on or off responsive to a change in a voltage level of the output signal.

3. The power monitoring circuit of claim 2, wherein the output signal is an oscillating signal, and wherein the power monitoring circuit further comprises:

a frequency to voltage converter coupled to the first comparator circuit and configured to generate an output voltage having a voltage level corresponding to a frequency of the output signal; and a second comparator circuit coupled to the frequency to voltage converter, the second comparator circuit configured to compare the output voltage to a threshold voltage to generate an overpower signal representing a difference between the output voltage and the threshold voltage.

4. The power monitoring circuit of claim 3, wherein the frequency to voltage converter is a linear frequency to voltage converter.

5. The power monitoring circuit of claim 3, further comprising:

a digital-to-analog converter (DAC) having a DAC output coupled to the second comparator circuit, the DAC configured to generate an analog version of a digital configuration signal as the threshold voltage.

6. The power monitoring circuit of claim 2, further comprising:

A flip-flop coupled to the first comparator circuit, the flip-flop configured to receive the output signal and to store the received output signal.

7. The power monitoring circuit of claim 1, wherein the divider circuit is configured to receive as an input a first voltage, a second voltage, and the regulator voltage, and wherein the divider circuit is configured to generate an output having a voltage level representing a product of the first voltage and the second voltage divided by the regulator voltage.

8. The power monitoring circuit of claim 7, wherein the divider circuit is an analog divider circuit.

9. The power monitoring circuit of claim 7, further comprising:

a digital-to-analog converter (DAC) coupled to the divider circuit, the DAC configured to receive a configuration signal and generate an analog version of a digital configuration signal as the first voltage.

10. The power monitoring circuit of claim 1, wherein the integrator circuit is a capacitor configured to receive the one or more regulator currents and generate the integrator voltage based on an amount of charge stored by the capacitor.

11. The power monitoring circuit of claim 1, wherein the clear switch is controlled by a periodic signal that turns the clear switch on for a predetermined amount of time with a predetermined frequency.

12. A method for monitoring a power of a switching regulator, comprising:

generating a reference voltage that is inversely proportional to a regulator voltage of the switching regulator;

integrating one or more regulator currents of the switching regulator to generate an integrator current with an integrator voltage;

comparing the integrator voltage to the regulator voltage; and generating an output signal in response to the integrator voltage exceeding the regulator voltage.

13. The method of claim 12, wherein the output signal is an oscillating signal, and wherein the method further comprises:

generating an output voltage corresponding to a frequency of the output signal;

comparing the output voltage to a threshold voltage; and generating an overpower signal representing a difference between the output voltage and the threshold voltage.

14. The method of claim 13, further comprising:

resetting, based on the output signal, an integrator that generates the integrator voltage based on the one or more regulator currents.

15. The method of claim 13, further comprising:

storing the generated output signal in a flip-flop.

16. The method of claim 13, further comprising:

generating the threshold voltage by converting a digital configuration signal to an analog voltage.

17. The method of claim 12, further comprising:

generating a first voltage by converting a digital configuration signal to an analog voltage, and wherein the reference voltage is directly proportional to the first voltage.

18. The method of claim 17, wherein generating the reference voltage comprises:

dividing the first voltage by the regulator voltage.

19. An electronic device comprising:

a switching regulator; and a power monitoring circuit, comprising:

a divider circuit configured to generate a reference voltage inversely proportional to a regulator voltage of the switching regulator;

an integrator circuit configured to integrate a regulator current of the switching regulator to generate an integrator current with an integrator voltage;

a clear switch coupled to the integrator circuit, the clear switch configured to clear the integrator responsive to switching of the clear switch; and a first comparator circuit having a first input coupled to the divider circuit for receiving the reference voltage, and a second input coupled to the integrator circuit for receiving the integrator voltage, the first comparator circuit configured to generate an output signal in response to the integrator voltage exceeding the reference voltage.

20. The electronic device of claim 19, wherein the clear switch is controlled to turn on or off responsive to a change in a voltage level of the output signal, and wherein the electronic device further comprises:

a frequency to voltage converter coupled to the first comparator circuit and configured to generate an output voltage having a voltage level corresponding to a frequency of the output signal; and a second comparator circuit coupled to the frequency to voltage converter, the second comparator circuit configured to compare the output voltage to a threshold voltage to generate an overpower signal representing a difference between the output voltage and the threshold voltage.

* * * * *